United States Patent
Hsu et al.

(10) Patent No.: US 9,196,717 B2
(45) Date of Patent: Nov. 24, 2015

(54) HIGH VOLTAGE METAL-OXIDE-SEMICONDUCTOR TRANSISTOR DEVICE

(71) Applicant: UNITED MICROELECTRONICS CORP., Hsin-Chu (TW)

(72) Inventors: Ming-Shun Hsu, Miaoli County (TW); Ke-Feng Lin, Taipei (TW); Chih-Chung Wang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 26 days.

(21) Appl. No.: 13/629,609

(22) Filed: Sep. 28, 2012

(65) Prior Publication Data

US 2014/0091369 A1    Apr. 3, 2014

(51) Int. Cl.
*H01L 29/78* (2006.01)
*H01L 29/06* (2006.01)
*H01L 29/08* (2006.01)

(52) U.S. Cl.
CPC .............. *H01L 29/78* (2013.01); *H01L 29/063* (2013.01); *H01L 29/0653* (2013.01); *H01L 29/0878* (2013.01); *H01L 29/7816* (2013.01); *H01L 29/0692* (2013.01)

(58) Field of Classification Search
CPC ............ H01L 29/6659; H01L 29/7833; H01L 21/823807
USPC ........................... 257/288, 328, 335, 345, 346
See application file for complete search history.

(56) References Cited

U.S. PATENT DOCUMENTS

| | | | |
|---|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |

(Continued)

OTHER PUBLICATIONS

Hsu, Title: Transistor Device and Manufacturing Method Thereof, U.S. Appl. No. 13/525,471, filed Jan. 18, 2012.

*Primary Examiner* — Matthew W Such
*Assistant Examiner* — Warren H Kilpatrick
(74) *Attorney, Agent, or Firm* — Winston Hsu; Scott Margo

(57) ABSTRACT

A HV MOS transistor device is provided. The HV MOS transistor device includes a substrate comprising at least an insulating region formed thereon, a gate positioned on the substrate and covering a portion of the insulating region, a drain region and a source region formed at respective sides of the gate in the substrate, and a first implant region formed under the insulating region. The substrate comprises a first conductivity type, the drain, the source, and the first implant region comprise a second conductivity type, and the first conductivity type and the second conductivity type are complementary to each other.

15 Claims, 5 Drawing Sheets

(56) References Cited

U.S. PATENT DOCUMENTS

| | | |
|---|---|---|
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1* | 7/2002 | Tsai et al. ............... 257/335 |
| 6,514,830 B1 | 2/2003 | Fang |
| 6,521,538 B2 | 2/2003 | Soga |
| 6,614,089 B2 | 9/2003 | Nakamura |
| 6,639,277 B2* | 10/2003 | Rumennik et al. ........ 257/343 |
| 6,700,160 B1* | 3/2004 | Merchant ................. 257/338 |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,873,011 B1* | 3/2005 | Huang et al. ............. 257/345 |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,161,198 B2* | 1/2007 | Omi et al. ................ 257/288 |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 8,026,549 B2 | 9/2011 | Chen |
| 2002/0098637 A1* | 7/2002 | Hossain et al. .............. 438/200 |
| 2002/0171103 A1* | 11/2002 | Spadea ..................... 257/328 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0085113 A1* | 4/2009 | Izumi et al. ............... 257/343 |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0025764 A1* | 2/2010 | Kitajima et al. ........... 257/343 |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2012/0193709 A1* | 8/2012 | Sukegawa et al. ......... 257/337 |

\* cited by examiner

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (herein after abbreviated as HV MOS) transistor device, and more particularly, to a high voltage lateral double-diffused metal-oxide-semiconductor (HV-LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dopant concentration and large area. The drift region is used to alleviate the high voltage between the drain and the source, therefore the LDMOS transistor device can have higher breakdown voltage. The dope concentration and length of the lateral-diffused drift region affects the breakdown voltage (BVD) and the ON-resistance (hereinafter abbreviated as $R_{ON}$) of the HV-LDMOS transistor device.

It is well-known that characteristics of low $R_{ON}$ and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a HV MOS transistor device is provided. The HV MOS transistor device includes a substrate having at least an insulating region formed thereon, a gate positioned on the substrate and covering a portion of the insulating region, a drain region and a source region having a first conductivity type formed at respective sides of the gate in the substrate, and a first implant region having the first conductivity type formed under the insulating region.

According to the HV MOS transistor device provided by the present invention, $R_{ON}$ of the HV MOS transistor is effectively reduced due to the first implant region formed under the insulating region. Therefore the $R_{ON}$/BVD ratio is desirably lowered.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
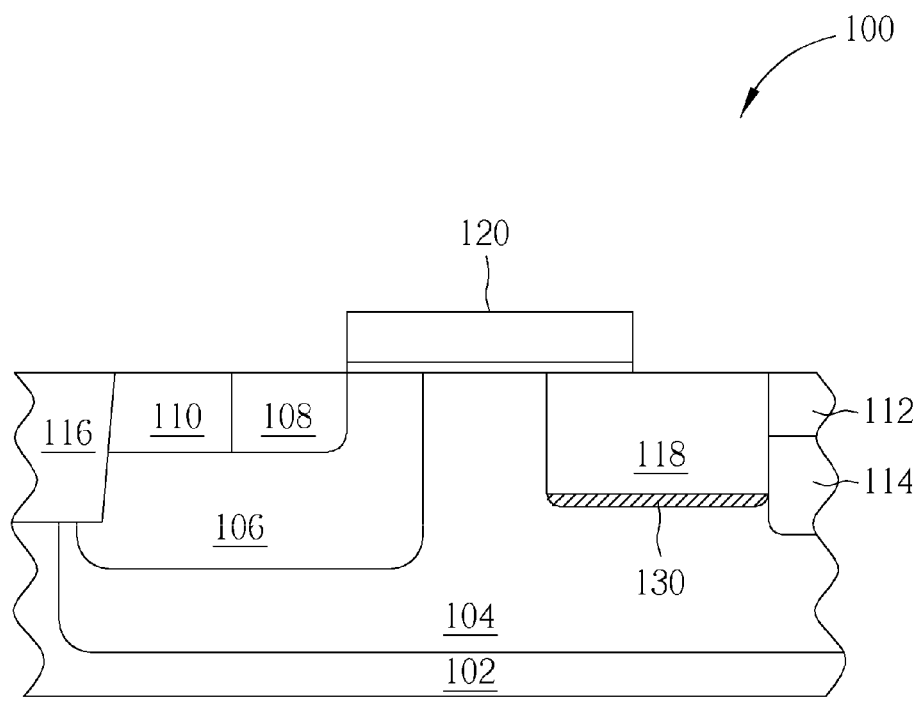
FIG. 1 is a cross-sectional view of a HV MOS transistor device provided by a first preferred embodiment of the present invention.

Please refer to FIG. 1, which is a cross-sectional view of a HV MOS transistor device provided by a first preferred embodiment of the present invention. As shown in FIG. 1, a HV MOS transistor device 100 provided by the preferred embodiment is positioned on a substrate 102, such as a silicon substrate. The substrate 102 further includes a deep well region 104 formed therein. The substrate 102 includes a first conductivity type and the deep well region 104 includes a second conductivity type. The second conductivity type and the first conductivity type are complementary to each other. In the preferred embodiment, the first conductivity type is p-type and thus the second conductivity type is n-type. The HV MOS transistor device 100 further includes a gate 120 positioned on the substrate 102. A body region 106 is formed in the deep well region 104. The body region 106 includes the first conductivity type and thus is a p-body region 106. A source region 108 and a drain region 112 are formed in the substrate 102 at respective sides of the gate 120. Both of the source region 108 and the drain region 112 include the second conductivity type. Accordingly, the preferred embodiment provides an n-source region 108 and an n-drain region 112. As shown in FIG. 1, the source region 108 is formed in the p-body region 106. Furthermore, a p-doped region 110 is formed in the p-body region 106. The p-doped region 110 is electrically connected to the n-source region 108. Additionally, an n-well 114 is formed in the deep well region 104 at the drain side. As shown in FIG. 1, the drain region 112 is formed in the n-well 114. Moreover, a plurality of shallow trench isolations (STIs) 116 for electrically isolating the HV MOS transistor device 100 from other devices and an insulating region 118 are formed in the substrate 102. The insulating region 118 preferably includes a STI, but not limited to this. The gate 120 covers a portion of the insulating region 118 as shown in FIG. 1.

Please still refer to FIG. 1. The HV MOS transistor device 100 provided by the preferred embodiment further includes a first implant region 130 formed under the insulating region 118. As shown in FIG. 1, the insulating region 118 covers the first implant region 130 entirely. The first implant region 130 includes the second conductivity type, therefore the first implant region 130 is an n-typed implant region. A dopant concentration of the first implant region 130 is lower than a dopant concentration of the n-well region 114, and the dopant concentration of the n-well region 114 is lower than a dopant concentration of the source region 108 and of the drain region 112.

According to the first preferred embodiment, the n-type first implant region 130 entirely formed under the insulating region 118 effectively reduces $R_{ON}$ of the HV MOS transistor device 100. Therefore the $R_{ON}$/BVD ratio is desirably lowered.

Figure 2:
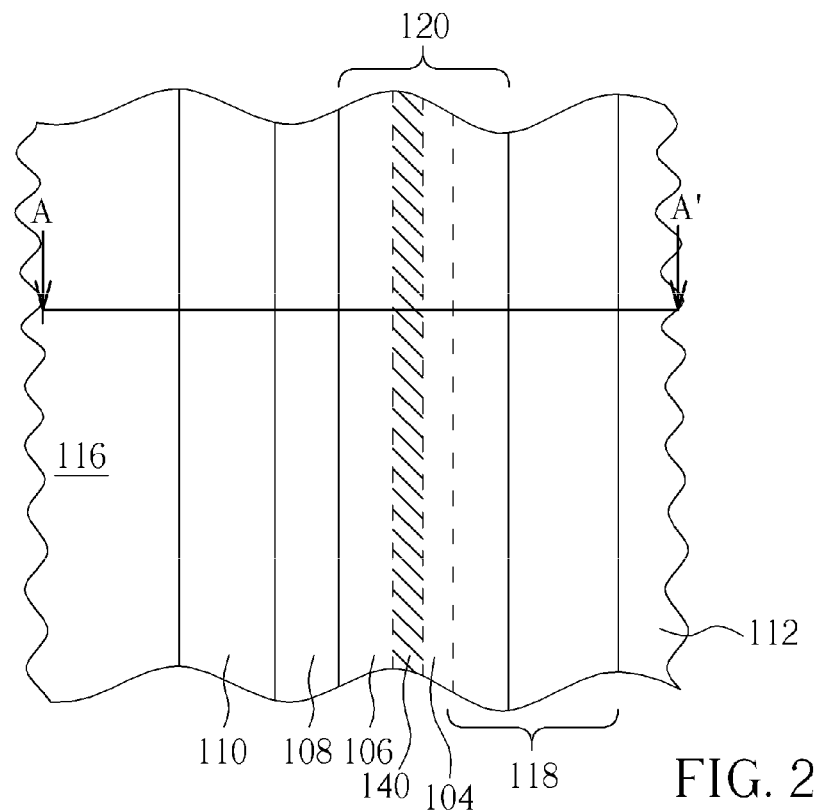
FIG. 2 is a schematic drawing of a portion of a layout pattern of a HV MOS transistor device provided by a second preferred embodiment of the present invention.
Figure 3:
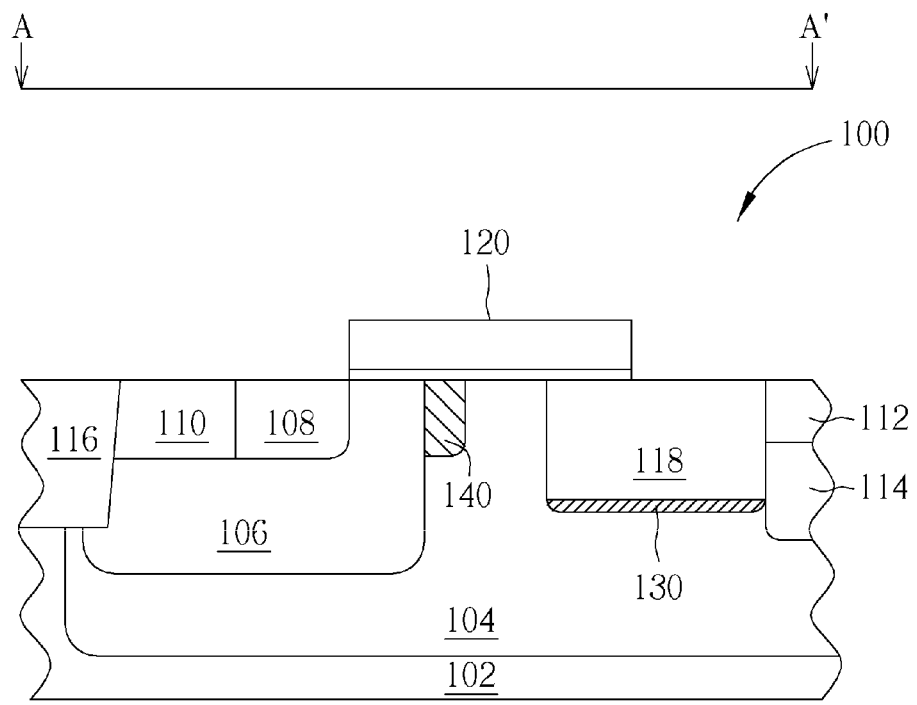
FIG. 3 is a cross-sectional view of the HV MOS transistor device taken along a line A-A' of FIG. 2.

Please refer to FIGS. 2-3, wherein FIG. 2 is a schematic drawing of a portion of a layout pattern of a HV MOS transistor device provided by a second preferred embodiment of the present invention, and FIG. 3 is a cross-sectional view of the HV MOS transistor device taken along a line A-A' of FIG. 2. It is noteworthy that elements the same in both of the first and second embodiments are designated by the same numerals, and details concerning those elements are omitted in the interest of brevity. As shown in FIGS. 2-3, the difference between the first and second preferred embodiment is: the HV MOS transistor device 100 provided by the second preferred embodiment further includes a second implant region 140.

As shown in FIGS. 2-3, the second implant region 140 is formed in the substrate 102 near the source region 108 and is entirely covered by the gate 120. More important, the second implant region 140 is spaced apart from the source region 108 by the body region 106 while the second implant region 140 is also spaced apart from the insulating region 118 by the deep well region 104. According to the preferred embodiment, the second implant region 140 includes a continuous region as shown in FIG. 2, but not limited to this. A depth of the second implant region 140 is smaller than a depth of the insulating region 118. The second implant region 140 includes the second conductivity, which means the second implant region 140 is an n-type implant region. A dopant concentration of the second implant region 140 is lower than a dopant concentration of the first implant region 130, the dopant concentration of the first implant region 130 is lower than a dopant concentration of the source region 108 and the drain region 112.

According to the HV MOS transistor device 100 provided by the second preferred embodiment, the n-typed first implant region 130 entirely formed under the insulating region 118 effectively reduces $R_{ON}$ of the HV MOS transistor device 100. More important, $R_{ON}$ is further reduced due to the n-typed second implant region 140 at the source side. Therefore the $R_{ON}$/BVD ratio of the HV MOS 100 provided by the second preferred embodiment is further lowered. Additionally, an additional n-drift region can further enhance the performance of the HV MOS transistor device 100.

Figure 4:
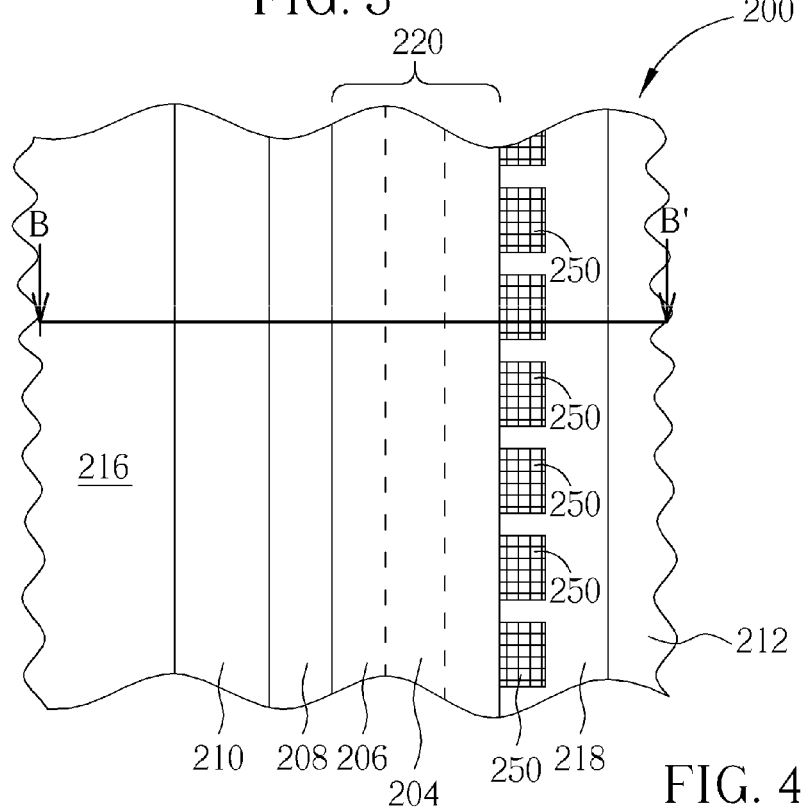
FIG. 4 is a schematic drawing of a portion of a layout pattern of a HV MOS transistor device provided by a third preferred embodiment of the present invention.
Figure 5:
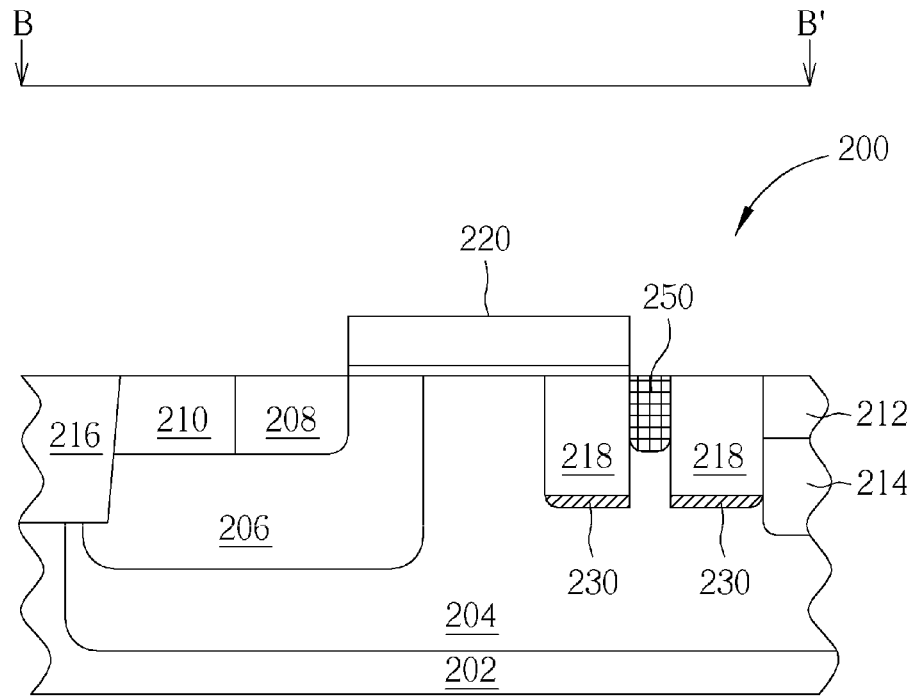
FIG. 5 is a cross-sectional view of the HV MOS transistor device taken along a line B-B' of FIG. 4.

Please refer to FIGS. 4-5, wherein FIG. 4 is a schematic drawing of a portion of a layout pattern of a HV MOS transistor device provided by a third preferred embodiment of the present invention, and FIG. 5 is a cross-sectional view of the HV MOS transistor device taken along line B-B' of FIG. 4. As shown in FIGS. 4-5, a HV MOS transistor device 200 provided by the preferred embodiment is positioned on a substrate 202. The substrate 202 further includes a deep well region 204 formed therein. Please note that the elements the same in the first, second, and third preferred embodiments include the same conductivity types, therefore those details are omitted for simplicity. The HV MOS transistor device 200 further includes a gate 220 positioned on the substrate 202. A body region 206 is formed in the deep well region 204. A source region 208 and a drain region 212 are formed in the substrate 202 at respective sides of the gate 220. As shown in FIG. 5, the source region 208 is formed in the p-body region 206. Furthermore, a p-doped region 210 electrically connected to the n-source region 208 is formed in the p-body region 206. Additionally, an n-well 214 is formed in the deep well region 204 at the drain side. As shown in FIG. 5, the drain region 212 is formed in the n-well 214. Moreover, a plurality of STIs 216 for electrically isolating the HV MOS transistor device 200 from other devices and an insulating region 218 are formed in the substrate 202. The insulating region 218 preferably includes a STI, but not limited to this. The gate 220 covers a portion of the insulating region 218 as shown in FIGS. 4-5.

Please refer to FIGS. 4-5 again. The HV MOS transistor device 200 provided by the third preferred embodiment further includes a plurality of diffusion islands 250 surrounded by the insulating region 218, and the diffusion islands 250 are spaced apart from each other by the insulating region 218. Furthermore, a depth of the diffusion islands 250 is smaller than a depth of the insulating region 218. The diffusion islands 250 include a first conductivity type, which is complementary to the second conductivity type as mentioned above. In other words, the diffusion islands 250 are all p-typed.

Please still refer to FIG. 5. The HV MOS transistor device 200 provided by the second preferred embodiment still includes a first implant region 230 formed under the insulating region 218. As shown in FIG. 5, the insulating region 218 covers the first implant region 230 entirely. The first implant region 230 includes the second conductivity type. A dopant concentration of the first implant region 230 is lower than a dopant concentration of the n-well region 214, and the dopant concentration of the n-well region 214 is lower than a dopant concentration of the source region 208 and of the drain region 212.

According to the third preferred embodiment, the n-typed first implant region 230 entirely formed under the insulating region 218 effectively reduces $R_{ON}$ of the HV MOS transistor device 200. Furthermore, the p-typed diffusion islands 250 surrounded by the insulating region 218 provides a Reduced Surface Field (hereinafter abbreviated as RESURF) effect, therefore the current path of the HV MOS transistor 200 is shorter and the breakdown voltage in the vertical direction is improved. Since $R_{ON}$ is reduced while the breakdown voltage is increased, the $R_{ON}$/BVD ratio of the HV MOS transistor device 200 provided by the third preferred embodiment is further lowered.

Figure 6:
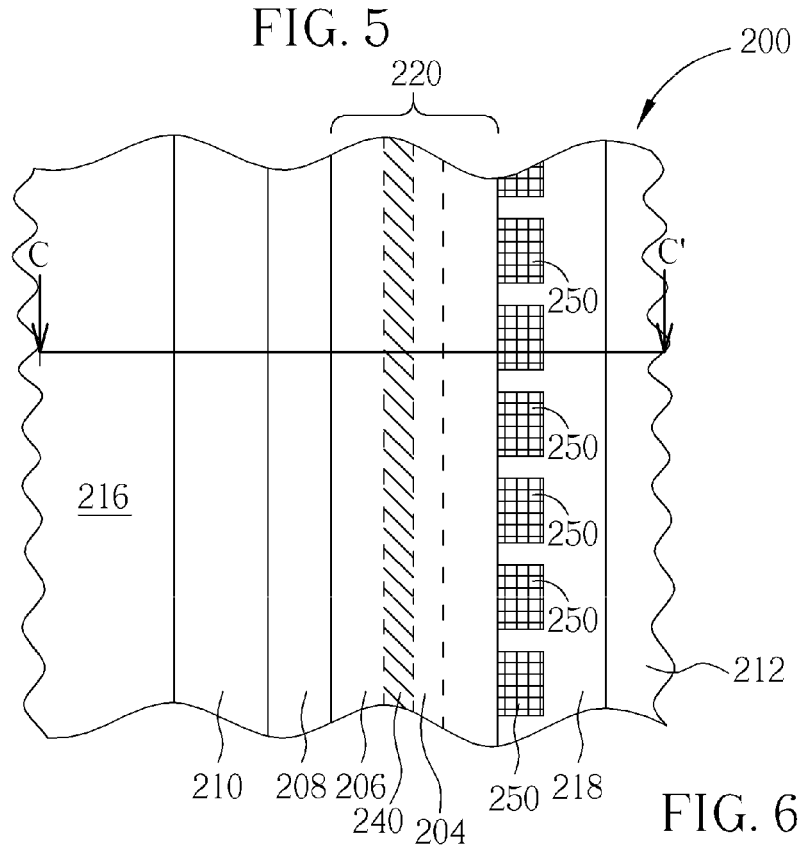
FIG. 6 is a schematic drawing of a portion of a layout pattern of a HV MOS transistor device provided by a fourth preferred embodiment of the present invention.
Figure 7:
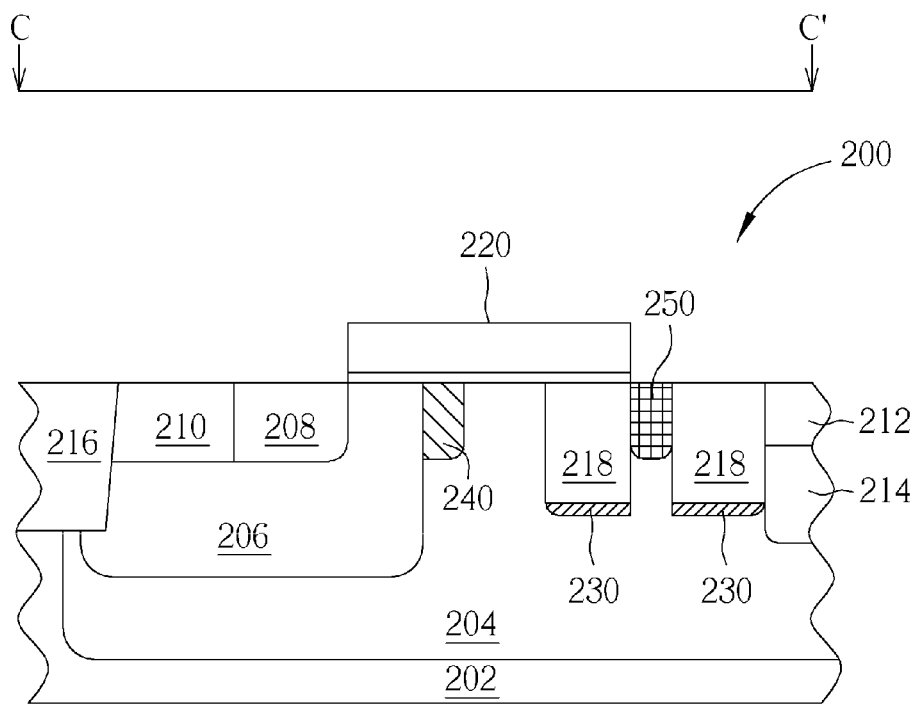
FIG. 7 is a cross-sectional view of the HV MOS transistor device taken along a line C-C' of FIG. 6.
Figure 8:
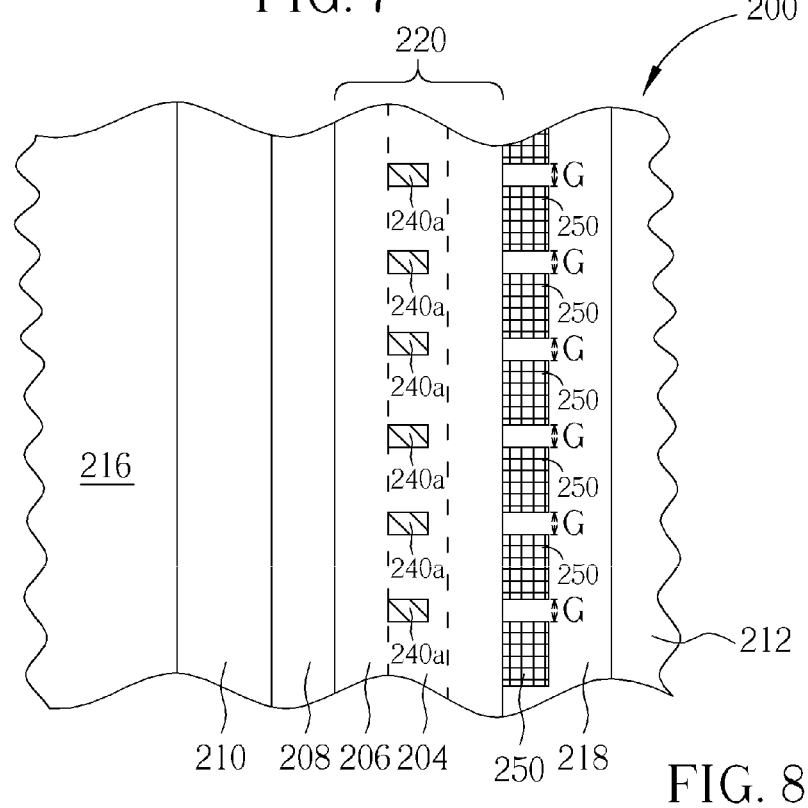
FIG. 8 is a schematic drawing of a portion of a layout pattern of a HV MOS transistor device provided by a modification to the fourth preferred embodiment.

Please refer to FIGS. 6-8, wherein FIG. 6 is a schematic drawing illustrating a portion of layout pattern of a HV MOS transistor device provided by a fourth preferred embodiment of the present invention, FIG. 7 is a cross-sectional view taken along line C-C' of FIG. 6, and FIG. 8 is a schematic drawing illustrating a portion of a layout pattern of a HV MOS transistor device provided by a modification to the fourth preferred embodiment. It is noteworthy that elements the same in the third and fourth embodiments are designated by the same numerals, and thus details concerning those elements are omitted in the interest of brevity. As shown in FIGS. 6-7, the difference between the third and fourth preferred embodiment is: the HV MOS transistor device 200 provided by the second preferred embodiment further includes a second implant region 240.

As shown in FIGS. 6-8, the second implant region 240 is formed in the substrate 202 near the source region 208 and is entirely covered by the gate 220. More important, the second implant region 240 is spaced apart from the source region 208 by the body region 206 while the second implant region 240 is also spaced apart from the insulating region 218 by the deep well region 204. A depth of the second implant region 240 is smaller than a depth of the insulating region 218. The second implant region 240 includes the second conductivity, which means the second implant region 240 is an n-type implant region. A dopant concentration of the second implant region 240 is lower than a dopant concentration of the first implant region 230, and the dopant concentration of the first implant region 230.

In order to clearly describe the difference between the fourth preferred embodiment and its modification, FIG. 6 and FIG. 8 should be referred together. As shown in FIG. 6, the second implant region 240 includes a continuous region. However, the second implant region 240 can include a plurality of islanding regions 240a as shown in FIG. 8. As mentioned above, the HV MOS transistor 200 provided by the fourth preferred embodiment includes the diffusion islands 250 spaced apart from each other by the insulating region 218. In other words, a gap G is formed in between any two adjacent diffusion islands 250. It is noteworthy that each islanding region 240a is formed corresponding to the gap G, respectively according to the modification.

According to the fourth preferred embodiment, the n-typed first implant region 230 entirely formed under the insulating region 218 and the n-typed second implant region 240 formed at the source side effectively reduce $R_{ON}$ of the HV MOS transistor device 200. Simultaneously, the p-typed diffusion islands 250 surrounded by the insulating region 218 provides a RESURF effect, therefore the breakdown voltage of the HV MOS transistor device 200 is improved. Since $R_{ON}$ is reduced while the breakdown voltage is increased, the $R_{ON}$/BVD ratio of the HV MOS 200 provided by the second preferred embodiment is further lowered.

Figure 9:
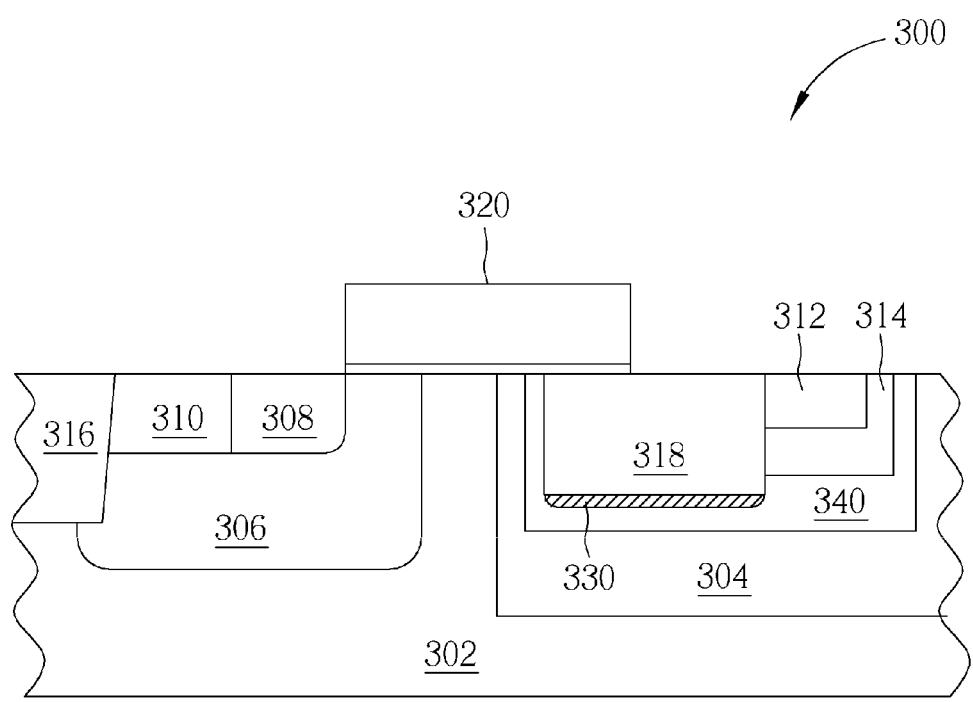
FIG. 9 is a cross-sectional view of a HV MOS transistor device provided by a fifth preferred embodiment of the present invention.

Please refer to FIG. 9, which is a cross-sectional view of a HV MOS transistor device provided by a fifth preferred embodiment of the present invention. As shown in FIG. 9, a HV MOS transistor device 300 provided by the preferred embodiment is positioned on a substrate 302. The substrate 302 further includes a high voltage well (HV well) region 304 and a body region 306 formed therein, and the HV well region 304 and the body region 306 are spaced apart from each other. The substrate 302, the HV well region 304, and the body region 306 all include a first conductivity type. Furthermore, the HV MOS transistor device 300 of the preferred embodiment includes a drift region 340 formed in the HV well region 304, and a doped region 314 formed in the drift region 340. The drift region 340 and the doped region 314 include a second conductivity type. The second conductivity type and the first conductivity type are complementary to each other. In the preferred embodiment, the first conductivity type is p-type and thus the second conductivity type is n-type.

Pleas still refer to FIG. 9. The HV MOS transistor device 300 further includes a gate 320 positioned on the substrate 302. A source region 308 and a drain region 312 are formed in the substrate 302 at respective sides of the gate 320. Both of the source region 308 and the drain region 312 include the second conductivity type. As shown in FIG. 9, the source region 308 is formed in the p-body region 306. Furthermore, a p-doped region 310 is formed in the p-body region 306. The p-doped region 310 is electrically connected to the n-source region 308. The drain region 312 is formed in doped region 314. As shown in FIG. 9, a plurality of STIs 316 for electrically isolating the HV MOS transistor device 300 from other devices and an insulating region 318 are formed in the substrate 302. The insulating region 318 preferably includes a STI, but not limited to this. As shown in FIG. 9, the insulating region 318 is formed in the drift region 340 and a portion of the insulating region 318 is covered by the gate 320.

Please refer to FIG. 9. The HV MOS transistor device 300 provided by the preferred embodiment further includes a first implant region 330 formed in the drift region 340 and under the insulating region 318. The insulating region 318 covers the first implant region 330 entirely. The first implant region 330 includes the second conductivity type.

According to the first preferred embodiment, the n-typed first implant region 330 entirely formed under the insulating region 318 effectively reduces $R_{ON}$ of the HV MOS transistor device 300. Therefore the $R_{ON}$/BVD ratio is desirably lowered.

According to the HV MOS transistor device provided by the present invention, $R_{ON}$ of the HV MOS transistor is effectively reduced due to the first implant region formed under the insulating region and the second implant region formed near the source side. Furthermore, the breakdown voltage is improved by the RESURF effect provided by the diffusion islands. Therefore the $R_{ON}$/BVD ratio is desirably lowered. Furthermore, it should be noted that the HV MOS transistor device provided by the preferred embodiment can employ common source approach or common source approach.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage metal-oxide-semiconductor (HV MOS) transistor device comprising:
   a substrate comprising at least an insulating region formed thereon, the substrate comprising a first conductivity type;
   a gate positioned on the substrate and covering a portion of the insulating region;
   a drain region and a source region having a second conductivity type formed at respective sides of the gate in the substrate, and the second conductivity type being complementary to the first conductivity type;
   a deep well region formed in the substrate, the deep well region comprising the second conductivity type;
   a first implant region having the second conductivity type formed under the insulating region; and
   a second implant region formed near the source region, the second implant region is spaced apart from the insulating region by the deep well region, wherein the second implant region comprises a plurality of islanding regions,
   wherein the insulating region covers the entire first implant region, and a width of the first implant region is equal to a width of the insulating region.

2. The HV MOS transistor device according to claim 1, wherein a dopant concentration of the first implant region is lower than a dopant concentration of the source region and the drain region.

3. The HV MOS transistor device according to claim 1, further comprising a plurality of diffusion islands surrounded by the insulating region, the diffusion islands having the first conductivity type.

4. The HV MOS transistor device according to claim 3, wherein the diffusion islands are spaced apart from each other by the insulating region.

5. The HV MOS transistor device according to claim 3, wherein a depth of the diffusion islands is smaller than a depth of the insulating region.

6. The HV MOS transistor device according to claim 1, wherein the gate covers the second implant region entirely.

7. The HV MOS transistor device according to claim 1, wherein the second implant region comprises the second conductivity type.

8. The HV MOS transistor device according to claim 1, further comprises a body region having the first conductivity type formed in the substrate.

9. The HV MOS transistor device according to claim 8, wherein the second implant region is spaced apart from the source region by the body region.

10. The HV MOS transistor device according to claim 1, wherein a dopant concentration of the second implant region is lower than a dopant concentration of the first implant region.

11. The HV MOS transistor device according to claim 1, wherein a depth of the second implant region is smaller than a depth of the insulating region.

12. The HV MOS transistor device according to claim 1, further comprising a doped region having the second conductivity type formed in the substrate.

13. The HV MOS transistor device according to claim 12, wherein the drain region, the insulating region, and the first implant region under the insulating region are all formed in the doped region.

14. The HV MOS transistor device according to claim 1, wherein an entire top of the first implant region contacts with a bottom of the insulating region.

15. The HV MOS transistor device according to claim 1, wherein the first implant region is singly formed under the insulating layer in a substrate-thickness direction.

\* \* \* \* \*